(12) United States Patent
Smith et al.

(10) Patent No.: US 7,747,399 B2
(45) Date of Patent: Jun. 29, 2010

(54) HOME ENERGY USE INDICATOR (75) Inventors: Wendell M. Smith, Smith's Parish (BM); Robert A. DeSorbo, Waitsfield, VT (US)

(73) Assignee: Polestar, Ltd. (BM)

(*) Notice: Subject to any disclaimer, the term of this patent is extended or adjusted under 35 U.S.C. 154(b) by 137 days.

(21) Appl. No.: 11/828,802

(22) Filed: Jul. 26, 2007

(65) Prior Publication Data

US 2008/0052017 A1 Feb. 28, 2008

Related U.S. Application Data (60) Provisional application No. 60/833,367, filed on Jul. 26, 2006.

(51) Int. Cl.
*G01R 19/00* (2006.01)

(52) U.S. Cl. ...................................................... 702/64

(58) Field of Classification Search .................... 702/57, 702/60, 64, 65, 80, 83, 176, 182–184, 188; 455/7; 700/293
See application file for complete search history.

(56) References Cited

U.S. PATENT DOCUMENTS

| | | | |
|---|---|---|---|
| 4,253,151 A | 2/1981 | Bouve | 364/483 |
| 4,399,510 A | 8/1983 | Hicks | 364/464 |
| 4,630,211 A | 12/1986 | Pettis | 364/464 |
| 4,644,320 A | 2/1987 | Carr et al. | 340/210 |
| 5,214,587 A | 5/1993 | Green | 364/464 |
| 5,635,895 A | 6/1997 | Murr | 340/310 |
| 5,684,710 A * | 11/1997 | Ehlers et al. | 700/293 |
| 6,078,785 A * | 6/2000 | Bush | 455/7 |
| 6,429,642 B1 | 8/2002 | Rodilla Sala | 324/142 |
| 6,476,592 B1 | 11/2002 | Humlum | 324/74 |
| 6,956,500 B1 | 10/2005 | Ducharme et al. | 340/870 |
| 7,043,380 B2 | 5/2006 | Rodenberg, III et al. | 702/62 |
| 7,183,669 B2 | 2/2007 | Schripsema et al. | 307/65 |
| 2004/0189462 A1 | 9/2004 | Eilers et al. | 340/531 |

* cited by examiner

*Primary Examiner*—Mohamed Charioui
(74) *Attorney, Agent, or Firm*—St. Onge Steward Johnston & Reens LLC (57) ABSTRACT

A system for monitoring electricity consumption in a building, comprising a transmitter connected to the primary electricity input of the building for wirelessly transmitting consumption data to at least one display device. The display device is adapted to receive data from the Internet for analysis and comparison to the consumption data generated by the transmitter. The transmitter includes an electricity detection circuit that comprises a diode bridge and a difference amplifier connected to a microprocessor.

21 Claims, 6 Drawing Sheets

HOME ENERGY USE INDICATOR

CROSS REFERENCE TO RELATED APPLICATIONS

The present application claims the benefit of priority under 35 U.S.C. §119(e) to U.S. Provisional Application No. 60/833,367 filed on Jul. 26, 2006, entitled "HomeEnergy use indicator," the entirety of which is incorporated by reference herein.

FIELD OF THE INVENTION

The present invention relates to a system for measuring and monitoring electricity consumption by a home, business, or other building. In particular, the present invention relates to a system for monitoring electricity consumption by a building which includes a simple circuit for detecting changes in electricity consumption.

BACKGROUND OF THE INVENTION

Over time the energy demand of the residential sector has increased significantly. Most modern homes contain a myriad of appliances that are powered by electricity, including dishwashers, toasters, air conditioners, and televisions. A modern home is almost constantly consuming electricity, but the magnitude of such consumption often varies depending on the time of year, week, and even varies drastically over the course of a day. Most consumers are only vaguely aware of the magnitude of their energy consumption at any given time.

Electric appliances that are promoted as being highly energy efficient have been brought to market in recent years. This is due, in part, to the rising consumer cost of electric energy, increasing concerns regarding the availability of resources necessary to generate electric energy, and the advance of technology. Unfortunately, most consumers are unaware of the difference in energy consumption and efficiency between a newer, more efficient electric appliance and an older electric appliance.

Moreover, as stated above, modern homes have a multitude of electric appliances of a multitude of types. With so many appliances, it is difficult to know which appliances have the largest impact on energy consumption. Most consumers are unaware of which of their appliances are most responsible for their energy cost.

To promote energy conservation in the home, federal and state governments have established minimum efficiency standards, weatherization subsidies, tax credits on programmable thermostats and urge consumers to allow higher in home temperatures in the summer and lower in home temperatures in the winter. One of the difficulties in promoting energy conservation is that few people are aware of the amount of energy they consume or the cost.

There are examples of devices and systems for monitoring energy consumption in the prior art. U.S. Pat. No. 6,956,500 to Ducharme et al. describes a device and method for measuring energy usage and electricity costs in real time. The device includes a camera assembly adapted to detect the velocity data of the rotating wheel disk on an electric power meter. The velocity data is sent by wireless transmission to an indoor display unit. The indoor display unit will display real-time electricity consumption.

The device described in Ducharme et al. suffers from significant drawbacks, however. First, the reliability and accuracy of the data generated by the camera assembly is doubtful and can be easily compromised by, for example, weather conditions. Ducharme et al. do disclose use of a weather shield, but this weather shield would not prevent, and indeed may exacerbate, the negative effects of heavy wind on the alignment of the device.

Other energy consumption monitoring systems utilize the existing electricity circuits of the building to transmit energy consumption data from measuring units to display units which are connected to standard wall sockets on the electricity circuit. One such device is described in U.S. Pat. No. 7,043,380 Rodenberg III et al. These systems also have significant disadvantages. First, the display unit is necessarily tied to at least one electric outlet. Second, many modern homes and businesses have more than one electricity circuit, and any data signal transmitted from the measurement units may not be available in portions of the building which are on different electricity circuits.

What is needed, therefore, is a system for monitoring electricity consumption that enables a home or business owner to readily and easily monitor and display energy consumption data in any part of the home or business. What is also needed is a system for monitoring electricity consumption that provides a display that alerts the homeowner when energy was being consumed and informed the homeowner of the significance of such consumption. What is further needed is a system for monitoring energy consumption that is capable of acquiring data from the Internet for analysis and comparison with the consumption data acquired by the system.

SUMMARY OF THE INVENTION

It is an object of the present invention to provide a system for monitoring electricity consumption that enables a home or business owner to readily and easily monitor and display energy consumption data in any part of the home or business.

It is a further object of the present invention to provide a system for monitoring electricity consumption that provides a display that alerts the homeowner when energy was being consumed and informed the homeowner of the significance of such consumption.

It is yet a further object of the present invention to provide a system for monitoring electricity consumption that is capable of acquiring data from the Internet for analysis and comparison with the consumption data acquired by the system.

These and other objects are accomplished by provision of a system for monitoring electricity consumption, comprising: a transmitter for wirelessly transmitting electricity consumption data, connected to a primary electricity input of a building and at least one display device adapted to receive electricity consumption data wirelessly from the transmitter and adapted to receive data from the Internet. The transmitter comprises an electricity consumption detection circuit and a wireless data transmission device. The electricity consumption detection circuit comprises a diode bridge and a difference amplifier connected to a microprocessor.

In some embodiments, the diode bridge is coupled to the primary electricity input of a building and converts alternating current to direct current having a voltage value corresponding to the voltage of the primary electricity input; the microprocessor samples the direct current from the diode bridge at regular intervals and stores the sampled voltage value as a stored value; the difference amplifier receives the direct current at a first terminal and receives a stored value from the microprocessor at a second terminal; and the difference amplifier compares the voltage value of the direct current to the stored value and outputs a difference signal to the microprocessor, wherein the difference signal corresponds to the voltage difference between the direct current and the stored value.

In some embodiments, the electricity consumption data is generated by the microprocessor and comprises data based on the difference signal; and wherein the electricity consumption data is transmitted to at least one display device. In some embodiments, the at least one display device is programmable to process and display electricity consumption data and data received from the Internet in a plurality of formats. In some embodiments, the at least one display device includes a data storage device for storing electricity consumption data and data received from the Internet. In some embodiments, the at least one display device includes an alarm function adapted to activate in response to the occurrence of at least one selected event. In some embodiments, the alarm function comprises activation of colored illumination devices for providing electricity consumption alerts. In some embodiments, the alarm function comprises activation of an audible alarm for providing electricity consumption alerts. In some embodiments, the at least one display device includes an image projector for projecting an image including electricity consumption data onto a surface. In some embodiments, at least one display device is a personal computer. In some embodiments, the personal computer wirelessly transmits data to at least one other display device.

According to a second embodiment of the present invention, a system for monitoring electricity consumption in a building is provided, comprising: a transmitter for wirelessly transmitting electricity consumption data, comprising an electricity consumption detection circuit, connected to a primary electricity input of a building; a personal computer adapted to receive electricity consumption data from the transmitter and adapted to receive data from the Internet; and at least one display device adapted to receive wireless data transmissions. The personal computer processes the electricity consumption data and the data from the Internet and wirelessly transmits data to the at least one display device.

In some embodiments, the electricity consumption detection circuit comprises a diode bridge and a difference amplifier connected to a microprocessor. The diode bridge is coupled to the primary electricity input of a building and converts alternating current to direct current having a voltage value corresponding to the voltage of the primary electricity input. The microprocessor samples the direct current from the diode bridge at regular intervals and stores the sampled voltage value as a stored value. The difference amplifier receives the direct current at a first terminal and receives a stored value from the microprocessor at a second terminal. The difference amplifier compares the voltage value of the direct current to the stored value and outputs a difference signal to the microprocessor, and the difference signal corresponds to the voltage difference between the direct current and the stored value.

In some embodiments, the electricity consumption data is generated by the microprocessor and comprises data based on the difference signal; and the electricity consumption data is transmitted to the personal computer. In some embodiments, the personal computer includes a data storage device for storing electricity consumption data and data received from the Internet. In some embodiments, the at least one display device includes an alarm function adapted to activate in response to the occurrence of at least one selected event. In some embodiments, the alarm function comprises activation of colored illumination devices for providing electricity consumption alerts. In some embodiments, the alarm function comprises activation of an audible alarm for providing electricity consumption alerts. In some embodiments, the at least one display device includes an image projector for projecting an image including electricity consumption data onto a surface.

The invention and its advantages will be more apparent from the following detailed description taken in conjunction with the accompanying drawings, wherein examples of the invention are described and shown.

DETAILED DESCRIPTION OF THE DRAWINGS

Exemplary embodiments of the present invention will now be described with reference to the drawings. As summarized above, the present invention is directed to a system for monitoring the consumption of electricity of a building. The present invention has many embodiments, and is not limited to those shown in the figures or described herein.

Figure 1:
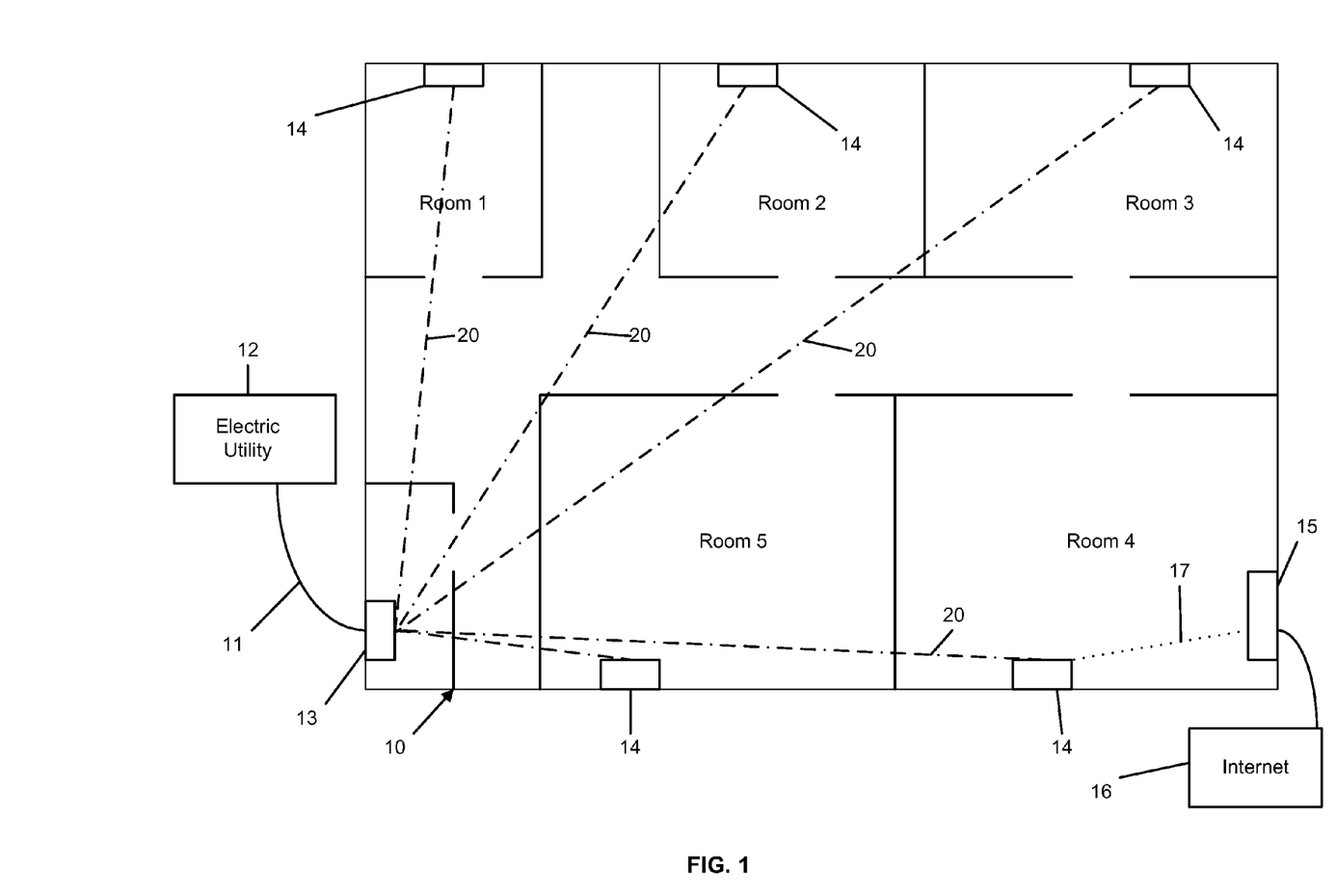
FIG. 1 is a schematic diagram of a system for monitoring electricity consumption according to an embodiment of the present invention.

FIG. 1 shows a schematic representation of an electricity consumption monitoring system according to the present invention. The primary electricity input line 11 brings electricity from the electric utility plant 12 to a building 10. Building 10 may be a residential building such as a house, or a commercial building, such as a store or office. As shown in FIG. 1, building 10 has a plurality of rooms. As is generally well known, electricity enters a building via an electric power meter installed by the electric utility company, such electric power meter being used to record the amount of electric power consumed by the building. Unfortunately, the standard power meter is not easily read by the owner of the building to determine the degree of consumption of electric power by the building. This is due, in part, because the power meter is often installed in a location that is inconvenient for viewing by the building's owner.

In embodiment of the present invention shown schematically in FIG. 1, a transmitter 13 is installed in building 10 and connected to the primary electricity input line 11. As described in more detail below, the transmitter 13 monitors the flow of electricity into building 10. Transmitter 13 derives this electricity consumption data from the primary input electricity line and transmits the data to one or more display devices 14. In other embodiments, transmitter 13 is connected to the building's electric power circuit at other locations, such as a portion of the circuit that powers one if the building's rooms.

In the embodiment shown schematically in FIG. 1, there are five display devices 14, one for each of rooms 1-5. In many embodiments, the display devices are mounted on the walls of the building in locations convenient for viewing. The transmitter 13 transmits data to the display devices 14 wirelessly, most preferably via electromagnetic waves from the radio frequency (RF) portion of the spectrum. Other types of wireless communication are employed in other embodiments. The wireless transmission of electricity data from the transmitter 13 to the display devices 14 is shown schematically by broken lines 20.

FIG. 1 also shows a modem 15 which is connected to the Internet, represented schematically as indicated by reference number 16. Modem 15 is connected to the Internet 16 via a digital subscriber line (DSL), cable television network, an ordinary dial-up system, or other suitable Internet connection. The modem 15 is used to transfer relevant data to at least one of the display devices 14 via a link shown schematically as broken line 17. In some embodiments, link 17 is a wireless connection, while in other embodiments a hard wire connection is used. As described in more detail below, at least one of the display devices 14 is adapted to process the data from the Internet in conjunction with the electricity consumption data received from the transmitter to provide useful consumption information to the owner of the building.

Figure 2:
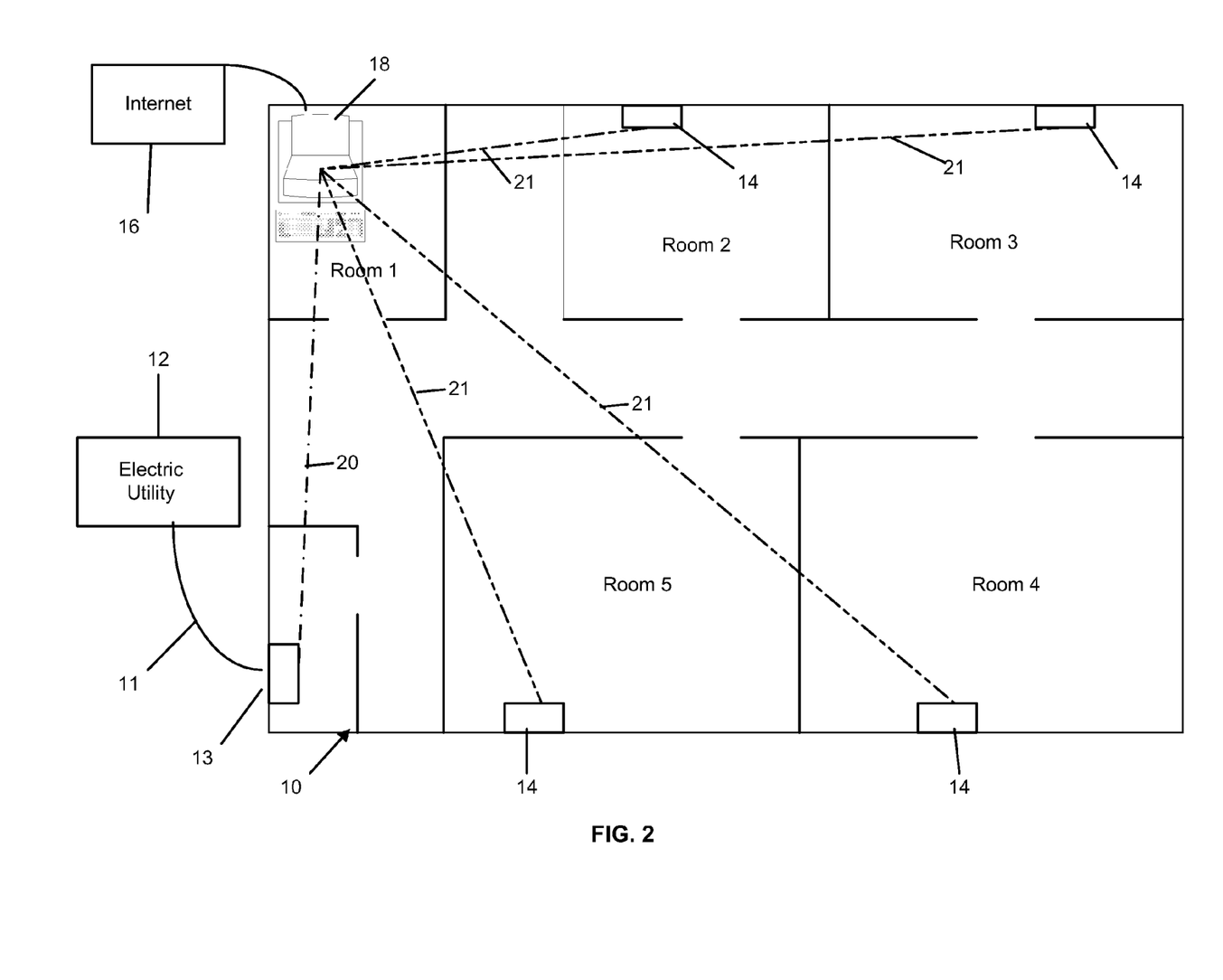
FIG. 2 is a schematic diagram of a system for monitoring electricity consumption according to a second embodiment of the present invention.

In some embodiments, each display device 14 is capable of receiving and processing data from the Internet via the modem 15. In other embodiments, only one display device receives and processes data from the Internet. This display device is provided with more robust processing capability relative to the other display devices, which may be adapted only to receive and display data. An example of such an embodiment is shown schematically in FIG. 2. In this embodiment, the transmitter 13 does not transmit electricity consumption data to each display device 14 directly. Instead, the transmitter 13 transmits its data to a single, more robust display device 14 for processing. In the embodiment shown in FIG. 2, such a display device is a personal computer (PC) 18 which is equipped with an antenna device for receiving the wireless transmissions from the transmitter 13.

PC 18 is equipped with software capable of processing and managing the electricity consumption data received from the transmitter 13. Such software is used to analyze the data and convert it into a form that is most useful for the owner of the building 10. As also shown schematically in FIG. 2, the PC 18 is connected to the Internet 16 for receiving relevant data for analysis and comparison with the electricity consumption data received from the transmitter 13. After such processing, analysis, and comparison, the PC 18 wirelessly transmits the data to one or more display devices 14 as shown schematically in FIG. 2 by broken lines 21. In some embodiments, a PC 18 is used as a display device alone, without additional display devices 14. In the embodiment shown in FIG. 1, where a traditional PC is not used, one or more of the display devices 14 are equipped with suitable software for performing the tasks of processing and managing the consumption data.

The relevant data downloaded from the Internet 16 includes a wide variety of information which is useful to electricity consumption monitoring and adds significant value to an electricity consumption monitoring system. The types of data of particular interest include up-to-date information on the price of the electricity being consumed by the building; historical and current weather data in the area of the building; and electricity consumption profiles for other similar buildings. Such information is very useful in conjunction with the real-time consumption data produced by the transmitter 13 for in-depth analysis of the energy efficiency of a building. The software loaded on both the PC 18 and on the display device 14 in the first embodiment is capable of utilizing relevant data from the Internet in conjunction with the electricity consumption data received from the transmitter 13 for such purposes.

Furthermore, display devices according to the present invention, such as devices 14 and particularly PC 18, advantageously include data storage means for storing electricity consumption data for historical analysis. Data storage is possible within the devices 14 or PC 18 on one or more magnetic hard drives, or may be stored in an off-site database accessible via the Internet.

Embodiments of the present invention, being connected to the Internet, include the advantageous feature of allowing off-site access to the electricity consumption data of the building. This feature is particularly valuable for business owners or for homeowners who travel often. When the electricity consumption data is stored in a database accessible via the Internet, the building owner can monitor and evaluate the consumption of the building through a remote terminal equipped with an Internet web browser. This allows the building owner to take appropriate action in the event of unexpected consumption spikes or drops.

Figure 3:
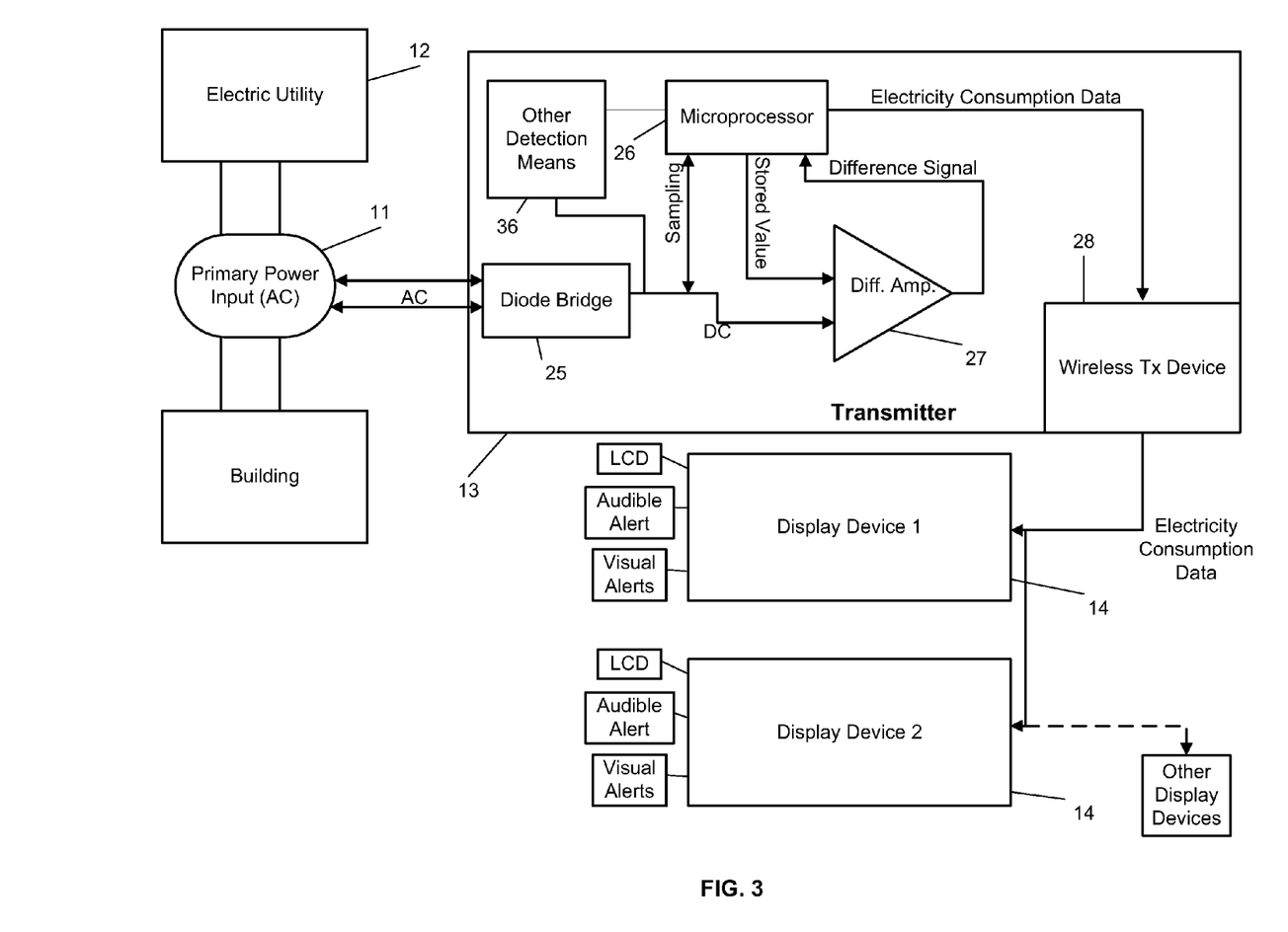
FIG. 3 is a schematic diagram of a system for monitoring electricity consumption according to an embodiment of the present invention.

The operation of an exemplary embodiment of the system is shown schematically in FIG. 3. The circuit shown schematically in FIG. 3 is designed to detect changes in the degree of consumption of electricity. Alternating current is produced by the electric utility 12, transmitted along wires to a primary electricity input line 11 which brings the electricity into the building 10. The transmitter 13 is coupled to the primary electricity input 11. The transmitter 13 includes an electricity consumption detection circuit which comprises a diode bridge 25, a difference amplifier 27, and a microprocessor 26. The diode bridge 25 converts the alternating current into direct current having a voltage value that corresponds to the voltage value of the electricity being drawn by the building. The microprocessor 26 samples the voltage value of the direct current and stores this value as a stored value. The microprocessor 26 is programmable to sample the voltage value of the direct current at any selected interval. The direct current goes into a first terminal of the difference amplifier 27. The microprocessor 26 sends the stored value to a second terminal of the difference amplifier 27 and the voltage value of the direct current is compared to that of the stored value. The difference amplifier 27 outputs a difference signal which is the difference between these voltage values. The difference signal is sent to the microprocessor 26. The difference signal is thus a voltage value that represents the change over time in the voltage of the primary electricity input line 11.

The microprocessor 26 processes the difference signal into electricity consumption data that is then sent to a wireless data transmission device 28. The wireless data transmission device 28 transmits the data to one or more display devices 14. The number of display devices 14 is varied according to the particular embodiment and building into which the system is installed. The display devices 14 have various outputs including an LCD, audible alerts, and visual alerts, as described below. The above-described circuit is used in conjunction with other circuits for detecting the total amount of electricity consumed in some embodiments. Such circuits are represented schematically in FIG. 3 by reference number 36. The electricity consumption data transmitted to the display devices therefore comprises data from the above-described circuit as well as other data gathered by other components of the transmitter 13.

Figure 4:
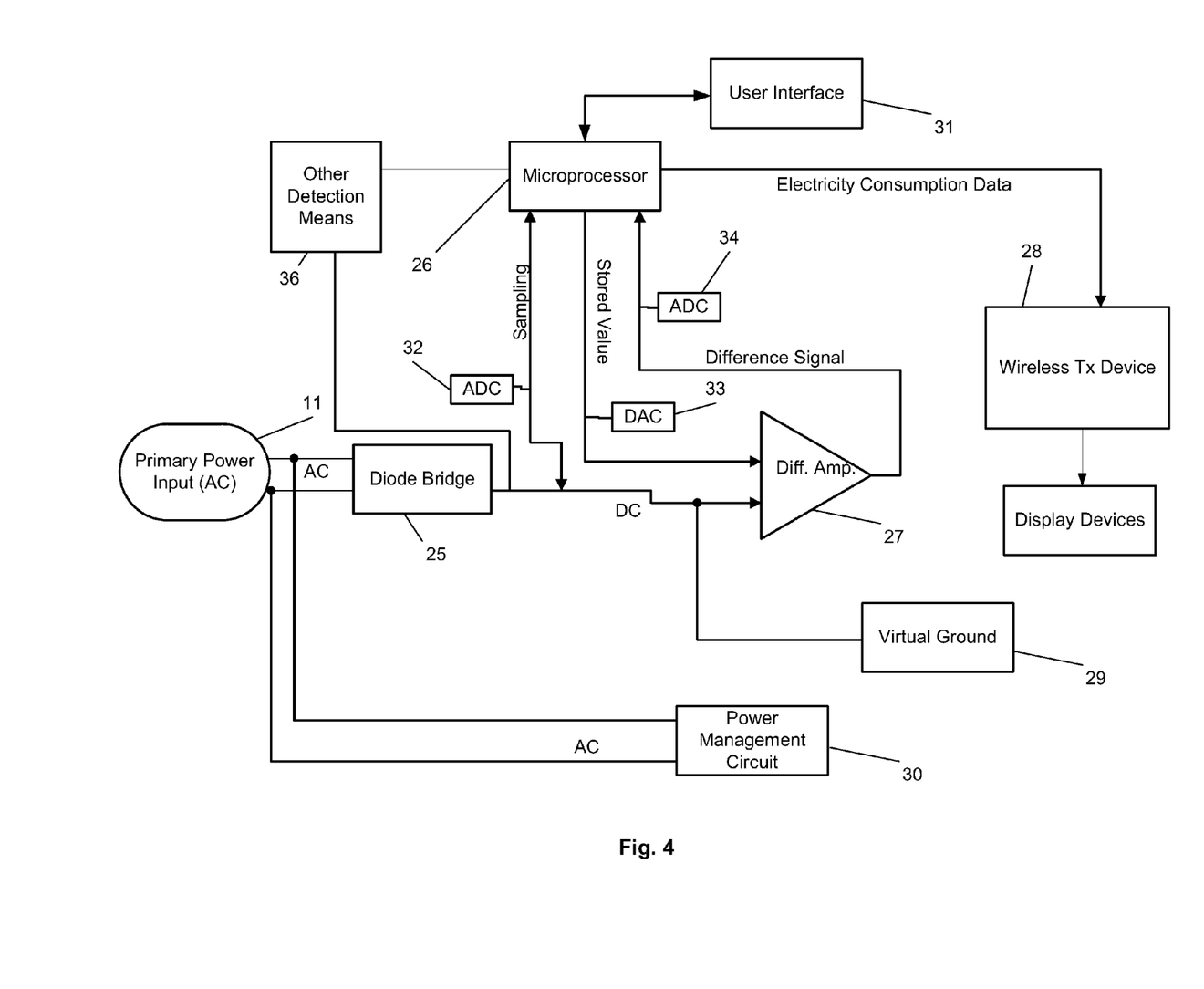
FIG. 4 is a schematic diagram showing details of the system for monitoring electricity consumption of FIG. 3.

FIG. 4 shows a more detailed schematic view of an electricity consumption detection circuit according to the present invention. The diode bridge 25, microprocessor 26 and difference amplifier 27 are coupled as shown in FIG. 3 to each other and to the primary electricity input 11. FIG. 4 shows that the sampling signal is passed through an analog-to-digital converter 32 between the diode bridge 25 and the microprocessor 26. The stored value is passed through digital-to-analog converter 33 between the microprocessor 26 and the difference amplifier 27. The difference signal is passed through analog-to-digital converter 34 between the difference amplifier 27 and the microprocessor 26. The above-described circuit is used in conjunction with other circuits for detecting the total amount of electricity consumed in some embodiments. Such circuits are represented schematically in FIG. 3 by reference number 36.

A user interface 31 is shown coupled to the microprocessor 26. The user interface 31 provides a means for programming the operation of the microprocessor 26. The virtual ground 29 is shown coupled to the first terminal of the difference amplifier 27. The virtual ground 29 biases the difference amp 27 so that negative voltage difference values can be detected. The virtual ground comprises a second difference amplifier (not shown). FIG. 4 also shows a power management circuit 30, which draws electric power from the alternating current input of the system and converts it to direct current for use in the components of the system. The virtual ground 29, the difference amplifier 27, the microprocessor 26, and the user interface 31 all derive electric power from the power management circuit 30. In other embodiments, additional system components are powered by power management circuit 30.

Figure 5:
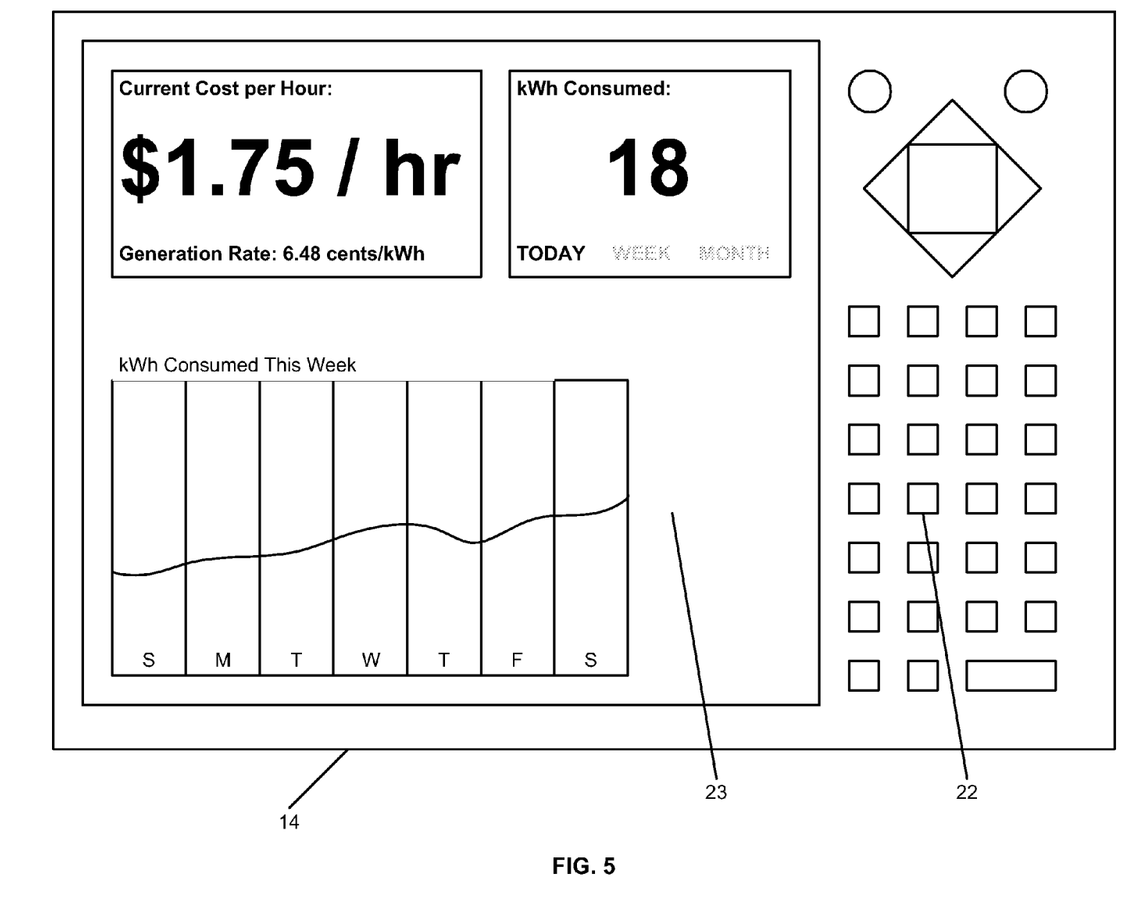
FIG. 5 is a perspective view of a display device according to an embodiment of the present invention.

FIG. 5 shows an exemplary embodiment of a wall-mounted display device 14. The display device 14 shown in FIG. 5 has an LCD screen 23 and an input pad 22. Input pad 22 comprises a plurality of buttons for inputting data. The LCD screen 23 is capable of displaying alphanumeric characters as well as graphical information in full color. FIG. 5 shows the LCD screen 23 showing consumption data in three formats: one portion of the screen shows a current cost per hour value, a second portion of the screen shows a total value of kWh consumed in the current day, and a third portion of the screen shows a graph of total kWh consumed per day over the span of a week. The display on LCD screen 23 is configurable to show electricity consumption data in a wide variety of formats and types. The user may configure the display to show only one format at a time in the largest possible characters for easy visual perception. On the other end of the spectrum, a user may configure the display to present a summary screen showing many electricity consumption statistics at a single time. Consumption data can be displayed in formats that include cost statistics, total consumption over a period of time, average consumption over a period of time, and the like. Other embodiments employ other types of suitable displays, such as plasma display panels (PDP), light emitting diode (LED) displays, and the like.

Figure 5A:
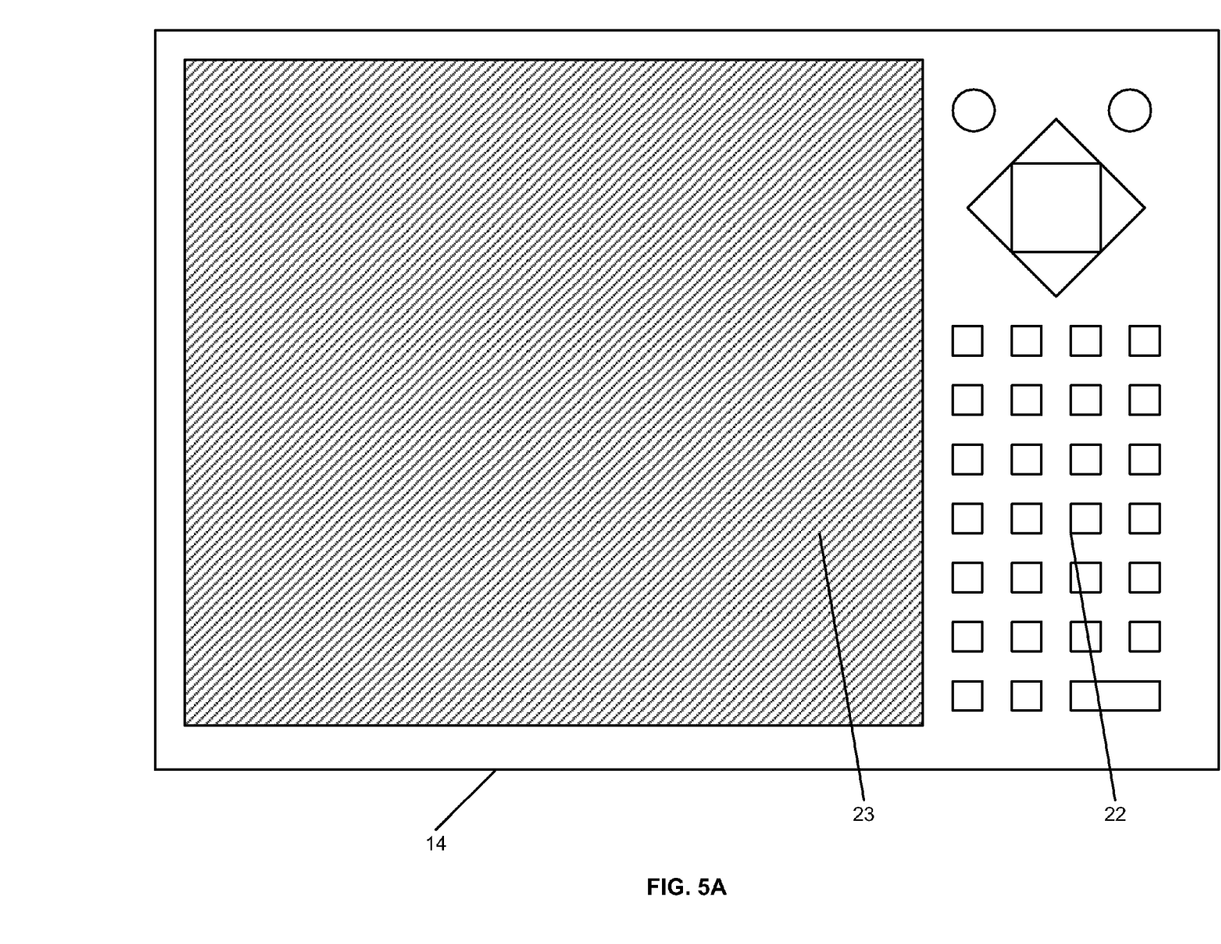
FIG. 5A is a perspective view of the display device of FIG. 5.

Embodiments of the present invention also have the capability of performing an alarm function in response to certain conditions of electricity consumption. FIG. 5A shows the wall-mounted display 14 of FIG. 5, wherein the LCD screen 23 is displaying a single, uniform color. The display devices 14 can be programmed to provide such color alerts when certain user-defined circumstances arise. For example, when the intensity of electricity consumption surpasses a selected level, the LCD will display a solid red color. Other examples include providing a color alert when the building's electricity consumption approaches or reaches a user-defined ceiling value. Alternatively, electricity cost values can also be used in conjunction with color alerts. Other colored illumination devices are used in some embodiments, for example, incandescent lights, light emitting diodes (LEDs), florescent lights, lava lamps, snow globes, and the like. In addition to color alerts as part of an alarm function, the display devices according to the present invention also include audible alarms in some embodiments. Such audible alarms include electronic buzzers, bells, and the like.

In addition to using colored illumination devices to signal alerts, illumination devices having variable light intensity are used to signal the degree of electricity consumption in some embodiments. The intensity of light from the illumination device is programmed to correspond to the amount of electricity being consumed, or the cost of such consumption.

In some advantageous embodiments of the present invention, at least one display device 14 that receives data for display is capable of projecting an image showing the data on a surface such as a wall. Such a display device 14 is programmable to display an image of the data at regular intervals or when certain selected events occur, such as when an electricity consumption limit is reached. Projection of the data onto a wall or ceiling of the building provides optimum visibility of the electricity consumption data gathered by the system. In some embodiments, the display device 14 will simply project a bright color onto the wall as an alert.

Thus, embodiments of the present invention provide an advantageous system for monitoring electricity consumption in a building, wherein helpful consumption alerts are provided to the owner or resident. While embodiments of the invention have been described using specific terms, this description is for illustrative purposes only. It will be apparent to those of ordinary skill in the art that various modifications may be made without departing from the spirit or scope of the invention, and that such modifications are intended to be within the scope of the present invention.

What is claimed is:

1. A system for monitoring electricity consumption, comprising:
  a transmitter for wirelessly transmitting electricity consumption data, comprising an electricity consumption detection circuit and a wireless data transmission device;
  at least one display device adapted to receive electricity consumption data wirelessly from the transmitter;
  wherein the electricity consumption detection circuit comprises a diode bridge and a difference amplifier connected to a microprocessor; and
  wherein the diode bridge is coupled to an electrical power circuit of a building and converts alternating current to direct current having a voltage value corresponding to a voltage of the electrical power circuit;
  the microprocessor samples the voltage value of the direct current from the diode bridge at selected intervals and stores the sampled voltage value as a stored value;
  the difference amplifier receives the direct current at a first terminal and receives a stored value from the microprocessor at a second terminal; and
  the difference amplifier compares the voltage value of the direct current to the stored value and outputs a difference signal to the microprocessor, wherein the difference signal corresponds to the voltage difference between the voltage value of the direct current and the stored value.

2. The system of claim 1, wherein the electricity consumption data is generated by the microprocessor and comprises data based on the difference signal; and wherein the electricity consumption data is transmitted to at least one display device.

3. The system of claim 2, wherein the at least one display device includes an alarm function adapted to activate in response to the occurrence of at least one selected event.

4. The system of claim 3, wherein the alarm function comprises activation of colored illumination devices for providing electricity consumption alerts.

5. The system of claim 3, wherein the alarm function comprises activation of an audible alarm for providing electricity consumption alerts.

6. The system of claim 2, wherein at least one display device is a personal computer.

7. The system of claim 6, wherein the personal computer wirelessly transmits data to at least one other display device.

8. The system of claim 2, wherein the at least one display device is programmable to process and display electricity consumption data and data received from the Internet in a plurality of formats.

9. The system of claim 2, wherein the at least one display device includes a data storage device for storing electricity consumption data and data received from the Internet.

10. The system of claim 2, wherein the at least one display device includes an image projector for projecting an image including electricity consumption data onto a surface.

11. The electrical circuit of claim 1, wherein the display device is adapted to receive data from the Internet.

12. A system for monitoring electricity consumption in a building, comprising:
a transmitter for wirelessly transmitting electricity consumption data, comprising an electricity consumption detection circuit that is connected to an electrical power circuit of the building;
a personal computer adapted to receive electricity consumption data from the transmitter and adapted to receive data from the Internet;
at least one display device adapted to receive wireless data transmissions;
wherein the personal computer processes the electricity consumption data and the data from the Internet and wirelessly transmits data to the at least one display device; and
wherein the electricity consumption detection circuit comprises a diode bridge and a difference amplifier connected to a microprocessor; and
wherein the diode bridge is coupled to the electrical power circuit and converts alternating current to direct current having a voltage value corresponding to a voltage of the electrical power circuit;
the microprocessor samples the voltage value of the direct current from the diode bridge at selected intervals and stores the sampled voltage value as a stored value;
the difference amplifier receives the direct current at a first terminal and receives a stored value from the microprocessor at a second terminal; and
the difference amplifier compares the voltage value of the direct current to the stored value and outputs a difference signal to the microprocessor, wherein the difference signal corresponds to the voltage difference between the direct current and the stored value.

13. The system of claim 12, wherein the electricity consumption data is generated by the microprocessor and comprises data based on the difference signal; and wherein the electricity consumption data is transmitted to the personal computer.

14. The system of claim 13, wherein the alarm function comprises activation of colored illumination devices for providing electricity consumption alerts.

15. The system of claim 14, wherein the alarm function comprises activation of an audible alarm for providing electricity consumption alerts.

16. The system of claim 13, wherein the personal computer includes a data storage device for storing electricity consumption data and data received from the Internet.

17. The system of claim 13, wherein the at least one display device includes an alarm function adapted to activate in response to the occurrence of at least one selected event.

18. The system of claim 13, wherein the at least one display device includes an image projector for projecting an image including electricity consumption data onto a surface.

19. The system of claim 12, wherein the transmitter is connected to a primary electricity input of a building.

20. An electrical circuit for detecting electricity consumption, comprising:
a diode bridge coupled to an electrical power circuit of a building, which converts alternating current to direct current having a voltage value corresponding to a voltage of the electrical power circuit;
a microprocessor that samples the voltage value of the direct current from the diode bridge at selected intervals and stores the sampled voltage value as a stored value; and
a difference amplifier that receives the direct current at a first terminal and receives a stored value from the microprocessor at a second terminal;
wherein the difference amplifier compares the voltage value of the direct current to the stored value and outputs a difference signal to the microprocessor; and
wherein the difference signal corresponds to the voltage difference between the voltage value of the direct current and the stored value.

21. The electrical circuit of claim 20, further comprising a data storage device for storing electricity consumption data derived from the difference signal.

* * * * *